United States Patent
Golden

(10) Patent No.: US 9,802,718 B2
(45) Date of Patent: Oct. 31, 2017

(54) DUTY CYCLE-BASED BIT INTERFACE SYSTEM

(71) Applicant: Hamilton Sundstrand Corporation, Charlotte, NC (US)

(72) Inventor: Brian R. Golden, DeKalb, IL (US)

(73) Assignee: HAMILTON SUNDSTRAND CORPORATION, Charlotte, NC (US)

(*) Notice: Subject to any disclaimer, the term of this patent is extended or adjusted under 35 U.S.C. 154(b) by 188 days.

(21) Appl. No.: 14/872,538

(22) Filed: Oct. 1, 2015

(65) Prior Publication Data
US 2017/0096239 A1    Apr. 6, 2017

(51) Int. Cl.
*G01R 31/00* (2006.01)
*B64F 5/00* (2017.01)
*B64F 5/60* (2017.01)
*B64F 5/40* (2017.01)

(52) U.S. Cl.
CPC .............. *B64F 5/0045* (2013.01); *B64F 5/40* (2017.01); *B64F 5/60* (2017.01); *G01R 31/005* (2013.01); *G01R 31/006* (2013.01); *G01R 31/008* (2013.01)

(58) Field of Classification Search
CPC ............ H02M 3/07; H02M 1/08; H02M 1/36; H02M 2003/075; H02M 2001/0009; B64F 5/00; B64F 5/40; B64F 5/60; G01R 31/005; G01R 31/006; G01R 31/008
See application file for complete search history.

(56) References Cited

U.S. PATENT DOCUMENTS

| | | | |
|---|---|---|---|
| 4,575,668 A | 3/1986 | Baker | |
| 5,481,194 A | 1/1996 | Schantz et al. | |
| 5,506,484 A | 4/1996 | Munro et al. | |
| 5,508,594 A | 4/1996 | Underwood et al. | |
| 5,764,165 A * | 6/1998 | Buch ........................ | H03M 5/08 341/152 |
| 5,933,453 A | 8/1999 | Lewison | |
| 6,931,579 B2 * | 8/2005 | Roberts .............. | G01R 31/3167 702/108 |

(Continued)

OTHER PUBLICATIONS

European Search Report for EP16191860.2, dated Feb. 24, 2017, 6 pages.

*Primary Examiner* — Thomas G Black
*Assistant Examiner* — Sze-Hon Kong
(74) *Attorney, Agent, or Firm* — Cantor Colburn LLP

(57) ABSTRACT

A duty cycle-based bit interface system includes a first stage voltage converter and second stage voltage converter in signal communication with the first stage voltage converter. The first stage voltage converter converts a digital voltage signal into an analog voltage signal. The second stage voltage converters convert the digital voltage signal into a scaled version of the same. A sampling unit is in signal communication with at least one of the second stage voltage converters, and is configured to sample a portion of the first stage analog output voltage signal during a sampling time period. The sampled portion has a duty cycle based-analog voltage signal during the sampling time period. A bit selector unit is in signal communication with the sampling unit, and outputs a bit enable signal that initiates a specific diagnostic test among a plurality of diagnostic tests based on the duty cycle of the sampled portion.

20 Claims, 3 Drawing Sheets

(56) References Cited

U.S. PATENT DOCUMENTS

| | | | | |
|---|---|---|---|---|
| 7,809,052 B2* | 10/2010 | Li | .................... | G01R 31/31709 |
| | | | | 375/226 |
| 7,978,109 B1* | 7/2011 | Kuramochi | ......... | H03M 1/0624 |
| | | | | 341/118 |
| 8,193,960 B2* | 6/2012 | Kuramochi | ......... | H03M 1/1061 |
| | | | | 341/144 |
| 8,768,563 B2 | 7/2014 | Nitzberg et al. | | |
| 8,873,211 B1* | 10/2014 | Butler | ...................... | H02H 9/04 |
| | | | | 361/86 |
| 2004/0095121 A1* | 5/2004 | Kernahan | ............. | H02M 3/156 |
| | | | | 323/283 |
| 2008/0143564 A1 | 6/2008 | Dent | | |
| 2009/0102514 A1 | 4/2009 | Hsu | | |
| 2011/0148499 A1* | 6/2011 | Kuramochi | ............. | H03M 1/06 |
| | | | | 327/306 |
| 2012/0169375 A1 | 7/2012 | Himpe | | |
| 2017/0026166 A1* | 1/2017 | Barrenscheen | .......... | G01D 4/00 |

\* cited by examiner

DUTY CYCLE-BASED BIT INTERFACE SYSTEM

TECHNICAL FIELD

Various embodiments relate generally to a bit interface system, and more particularly, to a duty cycle-based bit interface system.

BACKGROUND

Vehicle systems, and aircraft system in particular, typically require execution of various diagnostic and operating tests upon system startup. For instance, when one Line Replaceable Unit (LRU) initiates operational tests on another isolated, hardware based, LRU or subassembly, a means to command a series of tests is necessary. Conventional aircraft systems utilize a binary-based bit interface system to facilitate diagnostic testing. For instance, a set of discrete or dedicated input/output (I/O) lines are employed with each I/O line assigned a respective binary value. Outputting a bit on a particular I/O line indicates a command to execute the corresponding diagnostic test.

If, for example, seven diagnostic tests are required upon system startup, a three-digit binary code is necessary to identify each diagnostic test (i.e., 000, 001, 010, . . . 111). Thus, the binary-based bit interface system requires three additional dedicated bit lines necessary to generate the three-digit binary code. However, as the number of required diagnostic test increases, the number binary values and the amount of I/O lines must also increase. Consequently, the number of components, the data lines, the weight, and the overall costs associated with conventional binary-based bit interface systems can increase exponentially as the number of required diagnostic tests increase.

SUMMARY

According to a non-limiting embodiment, a duty cycle-based bit interface system includes a first stage voltage converter and second stage voltage converter in signal communication with the first stage voltage converter. The first stage voltage converter converts a digital voltage signal into an analog voltage signal. The second stage voltage converters convert the digital voltage signal into a scaled version of the same. A sampling unit is in signal communication with at least one of the second stage voltage converters, and is configured to sample a portion of the first stage analog output voltage signal during a sampling time period. The sampled portion has a duty cycle based-analog voltage signal during the sampling time period. A bit selector unit is in signal communication with the sampling unit, and outputs a bit enable signal that initiates a specific diagnostic test among a plurality of diagnostic tests based on the duty cycle of the sampled portion.

According to another non-limiting embodiment, a method of controlling a duty cycle-based bit interface system comprises converting a first stage voltage signal into a second stage voltage signal. The method further includes sampling a duty cycle-based analog output from a portion of a DAC signal from the first stage voltage signal during a sampling time period. The method further includes outputting a bit enable signal that initiates a specific diagnostic test among a plurality of diagnostic tests based on the duty cycle of the sampled portion.

BRIEF DESCRIPTION OF THE DRAWINGS

The subject matter which is regarded as the present disclosure is particularly pointed out and distinctly claimed in the claims at the conclusion of the specification. The foregoing and other features, and advantages of the present disclosure are apparent from the following detailed description taken in conjunction with the accompanying drawings in which:

DETAILED DESCRIPTION

Various embodiments offer the flexibility to adjust the number of diagnostic selections using a duty cycle-based bit interface system as opposed to a conventional binary-based bit interface system. According to at least one non-limiting embodiment, a duty cycle of a pulse width modulated input signal, such as a square waver, is varied to facilitate the selection of a specific diagnostic test among a plurality of different available tests. An arrangement of logic circuits compares the sampled duty cycle to a plurality of pre-defined duty cycle threshold range. Each duty cycle threshold range corresponds to a respective diagnostic test. Based on the comparison, the duty cycle-based bit interface system determines which particular diagnostic test is currently under command. Thus, unlike conventional binary-based bit interfaces that requires dedicating an individual I/O line to each binary digit used to generate the binary code for identifying a specific diagnostic test, the duty cycle-based bit interface system according to at least one non-limiting embodiment of the disclosure is capable of employing additional diagnostic tests without requiring additional I/O lines and components.

Figure 1:
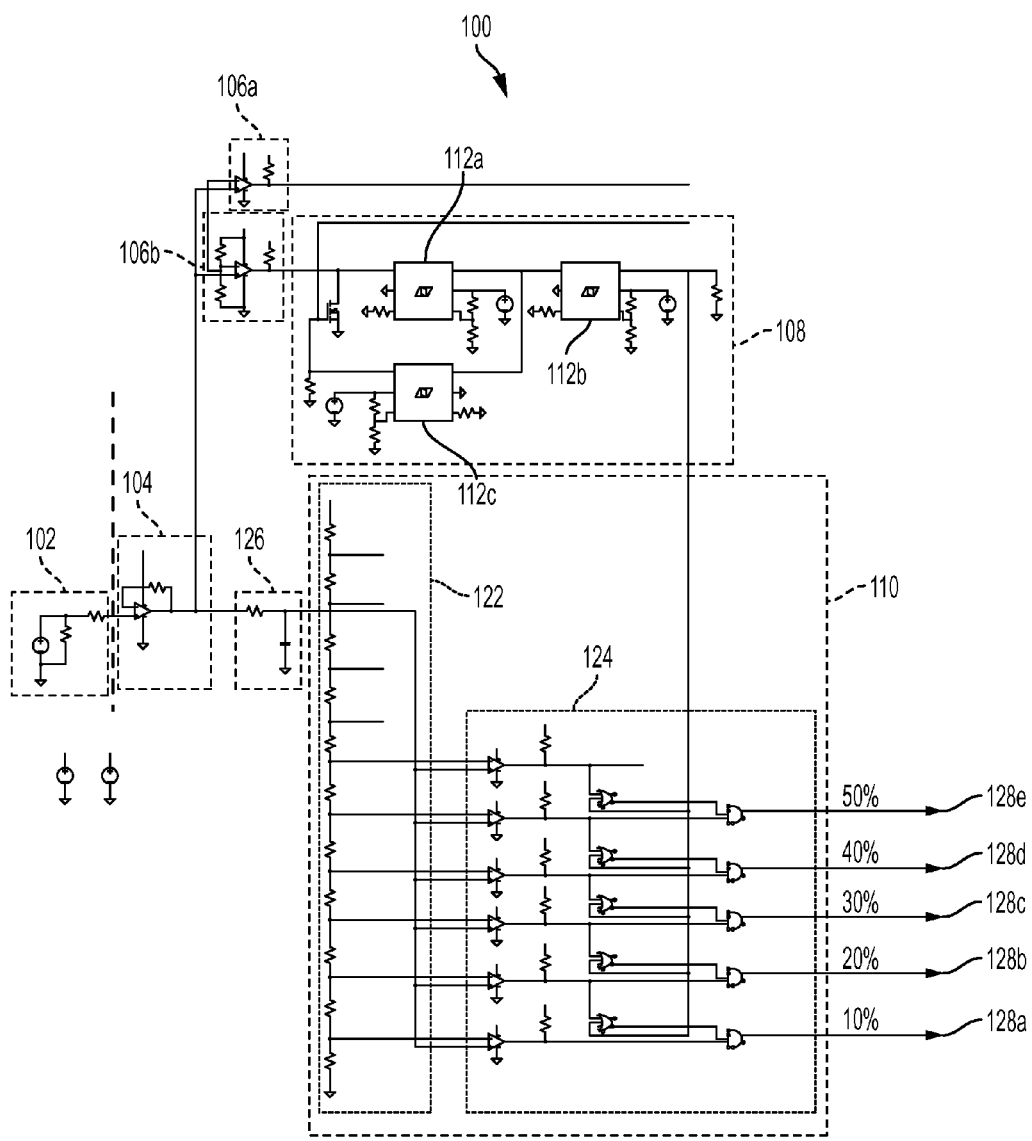
FIG. 1 is a diagram illustrating an electronic duty cycle-based bit interface system according to a non-limiting embodiment.

With reference now to FIG. 1, an electronic duty cycle-based bit interface system 100 is illustrated according to a non-limiting embodiment. The duty cycle-based bit interface system 100 includes an electronic generator control unit (GCU) 102, a power quality monitor (PQM) module 104, one or more voltage converter units 106a-106b, a duty cycle sampling circuit 108, an electronic bit generator circuit 110. According to a non-limiting embodiment, the duty cycle-based bit interface system 100 is installed in a vehicle such as, for example, and aircraft. The typical power input range for a 28 volt (V) aircraft system is 18V to 32V with transients up to 45V. Lightning transients are clamped by upstream 51V Transient Voltage Suppressor (TVS) to maintain voltage at the input below 60V.

The GCU 102 includes process logic to detect a system start up and upon system startup execute a series of diagnostic tests that are completed before the system may operate further. The diagnostic tests include, but are not limited to, a coil stimulation test, an under-voltage test, an over-voltage test, a clear-fault test, and a frequency enable test. The GCU 102 is programmed with diagnostic look-up table (LUT) that cross-references each diagnostic test to a pre-determined duty cycle. According to a non-limiting embodiment, each diagnostic test corresponds to a respective pre-defined duty cycle selected from 10%, 20%, 30%, 40%, 50%, 60%, 70%, 80%, and 90%, where 0% duty cycle value and 100% duty cycle value may be reserved for faulted conditions where the driving discrete output fails short (high) or fails open (low). For example, 10% duty is assigned to the coil stimulation test, 20% duty is assigned to the under-voltage test, 30% duty is assigned to the over-voltage test, 40% duty is assigned to the clear-fault test, and 50% duty is assigned to the frequency enable test. Remaining pre-defined duty cycle values (e.g., 60%-90%) may be assigned to additional diagnostic test assigned at a later date.

The PQM 104 is in signal communication with the GCU 102. The interface between the GCU 102 and PQM 104 is achieved, for example, using a 28 volt (V)/open discrete output and 28V/open discrete input. The discrete input includes a 1 kilo-ohm (kΩ) resistor, for example, to establish 28 milliamps (mA) from the discrete output at 28V. According to a non-limiting embodiment, the GCU 102 includes a pulse width modulation (PWM) circuit which serves as a digital signal source configured to generate a digital voltage signal. The digital voltage signal includes, for example, a square wave. The PWM circuit includes, for example, a rail-to-rail op amp stage which is configured as unity gain and operates in saturation so as to buffer the signal input to the PQM 104. An external resistor in series with the non-inverting input protects the op amp's internal diode when operating above the rail threshold.

The PQM first stage voltage converter 104 converts the frequency and/or duty cycle of the digital voltage signal based on a signal control command output by the GCU 102. For instance, the GCU 102 may command the PQM 104 to convert a square wave having a fixed frequency of approximately 400 hertz (Hz), for example. In addition, the GCU 102 may command the PQM 104 to convert the digital voltage signal with a duty cycle that matches one or more of the pre-defined duty cycle values assigned to a respective diagnostic test stored in the LUT. In this manner, the duty cycle-based bit interface system 100 can command execution of one or more diagnostic tests upon system startup.

The voltage converter units 106a-106b include a second stage voltage converter unit 106a and a second stage voltage converter unit 106b. Each of the second voltage converter units 106a-106b may be constructed, for example, as comparators. The second stage voltage converter unit 106a is configured to covert a digital voltage signal having a varied frequency and constant duty cycle into a scaled version of the same. For example, the second stage voltage converter converts the digital signal from 15V to 5V. Based on the second stage digital signal output, the duty cycle-based bit interface system 100 can execute a frequency stimulation diagnostic test. When executing the frequency stimulation diagnostic test, the duty cycle of the second stage digital signal output is fixed at 50%, for example, and the input frequency (e.g., 400 Hz) is varied to above and below the upper and lower frequency protection limits.

As mentioned above, the second stage voltage converter 106b is configured to covert a digital voltage signal having a fixed frequency and varied duty cycle into a scaled version of the same. According to a non-limiting embodiment, the frequency may be fixed at 400 Hz, for example, and the duty cycle is varied according to the specific test commanded by the GCU 102. In this manner, the second stage voltage converter 106b converts the first stage digital output signal into a signal capable of initiating a selection of the commanded diagnostic test during a specified window, i.e., sampling time period as discussed in greater detail a below.

The sampling circuit 108 includes a plurality of timers that serve as a controllable trigger that allows the bit selector unit 110 to sample the duty cycle based analog output 126 from the first stage voltage converter 104. According to a non-limiting embodiment, the plurality of timers including three non-retriggerable one shot timers 112a-112c.

The first timer 112a is in signal communication with the second stage voltage converter 106b to receive the converted digital voltage, and is activated, i.e., triggered, in response to a rising edge. When triggered, the first timer 112a provides a first positive output pulse of approximately 150 milliseconds (ms), for example.

The second timer 112b is in signal communication with the first timer 112a to receive the first positive output pulse, and is activated, i.e., triggered in response to a falling edge, after the first timer 112a has expired. When activated, the second timer 112b provides a negative pulse of approximately 25 ms, for example. The negative pulse generated by the second timer 112b essentially enables the sampling window which allows the 110 to sample the duty cycle based analog output 126 from the first stage voltage converter 104 to determine the diagnostic test under command as discussed in greater detail below.

The third timer 112c has an input that receives the first positive pulse generated first timer 112a and has an output that is connected to a switch. The switch may be configured as various semiconductor switching devices including, but not limited to, a metal-oxide-semiconductor field-effect transistor (MOSFET). When activated, the MOSFET prevents the first timer 112a from retriggering after expiration so as to govern sampling window enabled by second timer 112b. For instance, the third timer 112c is activated, i.e., triggered, in response to a rising edge, and provides a second positive pulse of approximately 200 ms, for example. The second positive pulse is output to the gate of the MOSFET. Accordingly, while the third timer 112c is activated, the first timer 112a is disabled and is prevented from triggering, i.e., outputting a new first positive pulse for the duration of the second positive pulse, i.e., 200 ms. In this manner, the analog converted signal output 126 from the first stage converter unit 104 is allowed to reach a final value before being sampled by the second timer 112b. During the final 25 ms of the sampling window, the GCU 102 will stop commanding the current diagnostic test and wait for a response from the PQM fault status BIT. The PQM 104 will begin generating the first stage digital signal for initiating the next diagnostic test commanded by the GCU 102 in response to the next rising edge.

Figure 2:
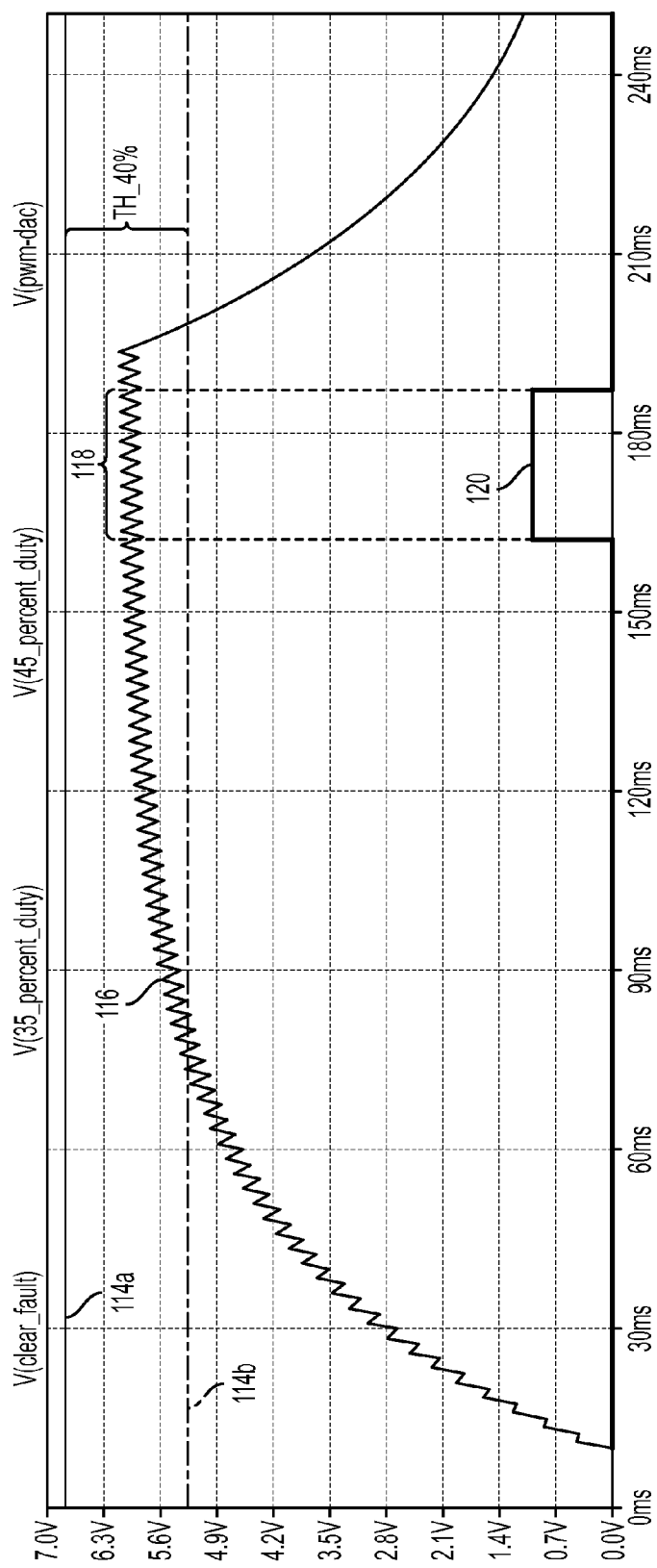
FIG. 2 is a signal diagram illustrating the operation of sampling a duty cycle to initiate a corresponding diagnostic test according to a non-limiting embodiment.

An example demonstrating the behavior of the candidate topology when sampling a 40% duty cycle corresponding to a 'clear fault' diagnostic test, for example, is selected. The upper signal 114a denotes the upper set point which in this case, for example, is at 45% of 15V or 6.75V. The lower signal 114b denotes the lower set point which in this case, for example, is 35% of 15V or 5.25V. Accordingly, the range (i.e., vertical distance) between the upper signal 114a and the lower signal 114b in this case, for example, defines the 40% duty cycle threshold range (TH_40%). The analog voltage signal 116 is the output of the low-pass filter and has a mean charge to approximately 40% of 15V, i.e., approximately 6V. When the analog voltage signal 116 is below the upper signal (i.e., the upper set point) and above the lower signal (i.e., the lower set point), and the sampling window 118 is enabled, i.e., the second timer 112b is active, the logic circuitry included in the 110 is satisfied such that the 110 enables the bit line as indicated by the enable output signal 120 corresponding to the "clear fault" diagnostic test so as to execute the clear fault test. Although FIG. 2 illustrates the operation for sampling a 40% duty cycle, it should be appreciated that similar operations can be executed to sample any of the duty cycles ranging from 0%-100% corresponding to various diagnostic test, respectively.

The bit selector unit 110 includes a duty cycle threshold generator 122 and test selector logical circuitry 124, which allows the duty cycle-based bit interface system 100 to identify and initiate each diagnostic test commanded by the GCU 102. According to a non-limiting embodiment, the duty cycle threshold generator 122 includes a resistor divider network which shares the same voltage reference of 15V as the PQM 104. The duty cycle-based bit interface system 100 includes, for example, a low pass filter 126 configured to convert the first stage digital signal output by the PQM 104 into an analog signal for use in comparison to 122. The voltage reference signal may have a value of approximately 15V, for example. Based on the voltage reference signal, the duty cycle threshold generator 122 generates a plurality of duty cycle ranges, where each range corresponds to a respective diagnostic test. If the value of the voltage reference signal changes, e.g., to 14.5V, the duty cycle threshold generator 122 scales the voltage reference signal accordingly and continues to report the diagnostic test as selected by the duty cycle.

According to a non-limiting embodiment, the duty cycle ranges are specified at 10% intervals ranging from 0% to 100%. Each interval is defined according to an upper set point and a lower point. The various set points are determined by a resistor divider, for example, so as to define a series of set points including 0%, 5%, 15%, 25%, 35%, 45%, 55%, 65%, 75%, 85%, 95%, and 100%. According to a non-limiting embodiment, 0% duty and 100% duty may be reserved for faulted conditions where the driving discrete output fails short (high) or fails open (low). Thus, each diagnostic test corresponds to a respective pre-defined duty cycle selected from 10%, 20%, 30%, 40%, 50%, 60%, 70%, 80%, and 90%. According to a non-limiting embodiment, the number of set points can be conveniently adjusted to if additional diagnostic test are to be employed in the system at a future date. For example, if there is a desire to increase the number of diagnostic tests, the RC time constant of the low pass filter 126 can be extended such that the ripple of the reference voltage signal is reduced. In this manner, additional duty cycle thresholds can be generated thereby. For example, the RC time constant of the low pass filter 126 can be increased such that the duty cycle thresholds are condensed from 10%, 20%, 30%, 40%, etc., to 5%, 10%, 15%, 20%, 25%, etc. Accordingly, more thresholds are provided, and hence an increased number of diagnostic tests can be employed in the duty cycle-based bit interface system 100 without requiring additional binary bit lines dedicated to generating the binary coding scheme utilized in conventional binary-based bit enable interfaces.

The test selector logical circuitry 124 includes a plurality of logical elements constructed to define individual bit enable lines 128a-128e. Although five bit enable lines 128a-128e are illustrated, it should be appreciated that the bit selector unit 110 may include additional spare lines that can be easily enabled should additional diagnostic tests be employed in the duty cycle-based bit interface system 100. As discussed above, when the duty cycle of the second voltage signal is below an upper set point (e.g., 45%) and above the lower set point (35%), and the second timer 112b is activated so as to enable the sampling window, the test selector logical circuitry 124 will determine which threshold range (e.g., TH_40%) the sampled duty cycle falls within. In response to detecting the threshold range (e.g., TH_40%), the test selector logical circuitry 124 enables the bit line 128a-128d (e.g., bit line 128d) corresponding to the identified duty cycle threshold range. A bit line 128-128d can be enabled by outputting an active high signal (e.g., a binary "1" value) onto the line. Accordingly, the enabled bit line indicates that the respective diagnostic test is currently under command from the GCU 102, and in turn the commanded diagnostic test is executed.

During operation, the analog voltage output from 126 is compared against the duty cycle threshold generator 122 by a plurality of comparators within 124. For example, 40% is provided to the plurality of comparators included in the logical circuitry 124. For the comparators whose voltage divided input value is less than 40% of the reference voltage, the output is pulled high, i.e. pulled to range of 5%-35%. For the comparators having voltage divided input value is greater than 40% of the reference voltage, the output is held low, i.e. to a range of 45%-55%. For example, when a value of 40% is commanded, the output corresponding to the comparator of the next lower threshold (e.g., 35%) is pulled high while the output corresponding to the comparator of the next higher threshold, (e.g. 45%) is held low. The 35% output is provided to the input of an AND gate, while the other input is provided from the output of the 45% NOR gate. The 45% output is provided to the input of a NOR gate, while the other input is provided from the output of the 112b timer. The two inputs of the NOR gate being low yield a high output which together with the other high input to the AND satisfy the selected bit test logic necessary to initiate the diagnostic test commanded by the GCU 102.

Figure 3:
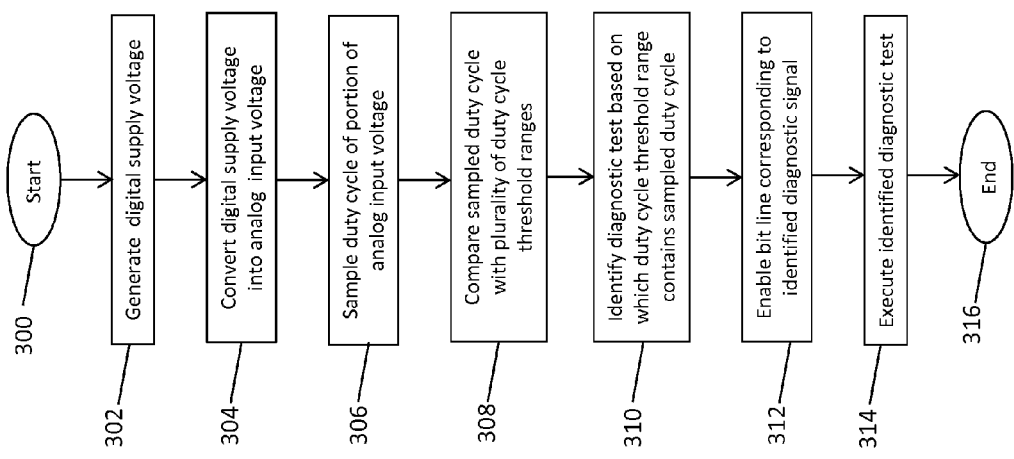
FIG. 3 is a flow diagram illustrating a method of controlling a duty cycle-based bit interface system according to a non-limiting embodiment.

Turning now to FIG. 3, a flow diagram illustrates a method of controlling a duty cycle-based bit interface system according to a non-limiting embodiment. The method begins at operation 300, and at operation 302 a digital voltage signal is generated. The digital voltage signal includes, for example, a digital square wave generated by a PWM circuit. The digital square wave may have a fixed frequency of approximately 400 Hz and a varied duty cycle. At operation 304, the digital voltage signal is converted into an analog voltage signal using, for example, a DAC. At operation 306, the duty cycle equivalent of a portion of the analog voltage signal is sampled during a specified window, i.e., sampling time period.

At operation 308, the sampled duty cycle based analog voltage signal is compared to a plurality of duty cycle threshold ranges. In at least one embodiment, the duty cycle is sampled just after executing the comparison based on the operation of the NOR gates included in the logical circuitry 124. According to a non-limiting embodiment, the duty cycle ranges are specified at 10% intervals ranging from 0% to 100%. Each interval is defined according to an upper set point and a lower point. The various set points are determined by a resistor divider, for example, so as to define a series of set points including 0%, 5%, 15%, 25%, 35%, 45%, 55%, 65%, 75%, 85%, 95%, and 100%. According to a non-limiting embodiment, 0% duty and 100% duty may be reserved for faulted conditions where the driving discrete output fails short (high) or fails open (low). Thus, each diagnostic test corresponds to a respective pre-defined duty cycle selected from 10%, 20%, 30%, 40%, 50%, 60%, 70%, 80%, and 90%.

At operation 310, a specific diagnostic test under command is identified based on which duty cycle threshold range contains the sampled duty cycle based analog voltage signal. For instance, a sampled duty cycle based analog voltage signal falling within the lower set point of 5% and the upper set point of 15% identifies a first diagnostic test such as an under-voltage simulation test, for example, assigned to the 10% duty cycle. Similarly, a sampled duty cycle falling within the lower set point of 15% and the upper set point of 25% identifies a second diagnostic test such as an over-voltage simulation test, for example, assigned to the 20% duty cycle.

At operation 312, the bit line corresponding to the specific diagnostic test under command is enabled. For example, a "1" is output to a first I/O bit line corresponding to the under-voltage simulation test when the sampled duty cycle based analog voltage signal falls between the 5% set point and the 15% set point. However, a "1" is output to a second I/O bit line corresponding to the over-voltage simulation test when the sampled duty cycle based analog voltage signal falls between the 15% set point and the 25% set point. At operation 314, the diagnostic test identified by the enabled I/O bit line is executed, and the method ends at operation 316.

As used herein, the term "module" or "unit" refers to an application specific integrated circuit (ASIC), an electronic circuit, an electronic computer processor (shared, dedicated, or group) and memory that executes one or more software or firmware programs, a microcontroller, a combinational logic circuit, and/or other suitable components that provide the described functionality. When implemented in software, a module can be embodied in memory as a non-transitory machine-readable storage medium readable by a processing circuit and storing instructions for execution by the processing circuit for performing a method.

As discussed in detail above, a duty cycle of a pulse width modulated input signal is varied to facilitate the selection of a specific diagnostic test among a plurality of different available tests. An arrangement of logic circuits compares the sampled duty cycle to a plurality of pre-defined duty cycle threshold range. Each duty cycle threshold range corresponds to a respective diagnostic test. Based on the comparison, the duty cycle-based bit interface system determines which particular diagnostic test is currently under command. Thus, unlike conventional binary-based bit interfaces that require dedicating an individual I/O line to each binary digit used to generate the binary code for identifying a specific diagnostic test, the duty cycle-based bit interface system according to at least one non-limiting embodiment of the disclosure is capable of employing additional diagnostic tests without requiring additional I/O lines.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

The invention claimed is:

1. A duty cycle-based bit interface system, comprising:
a first stage voltage converter unit in signal communication with a digital signal source, the first stage voltage converter configured to convert a digital voltage signal into an analog voltage signal;
a plurality of second stage voltage converters in signal communication with the first stage voltage converter; the second stage voltage converters configured to convert the digital voltage signal into a scaled version of the same;
an electronic sampling unit in signal communication with at least one of the second stage voltage converters, the sampling unit configured to sample a portion of the first stage analog output voltage signal during a sampling time period, the sampled portion having a duty cycle based-analog voltage signal during the sampling time period; and
an electronic bit selector unit in signal communication with the sampling unit, the bit selector unit configured to output a bit enable signal that initiates a specific diagnostic test among a plurality of diagnostic tests based on the duty cycle of the sampled portion.

2. The duty cycle-based bit interface system of claim 1, wherein at least one component of a vehicle is actuated in response to the bit enable signal so as to execute the specific diagnostic test.

3. The duty cycle-based bit interface system of claim 1, wherein the electronic bit selector unit outputs the bit enable signal based on a comparison between the duty cycle-based analog voltage signal of the sampled portion and a plurality of threshold duty cycle ranges.

4. The duty cycle-based bit interface system of claim 3, wherein each threshold duty cycle range corresponds to a specific diagnostic test among a plurality of different diagnostic tests.

5. The duty cycle-based bit interface system of claim 4, wherein the sampling unit comprises:
a first timing circuit that is initiated in response to a transition from one of the second stage voltage signals;
a second timing circuit that defines the sampling time period and outputs the sampled portion of the first stage analog output voltage signal to the bit selector unit; and
a third timing circuit that sets an overall time period and allows retriggering of the first timing circuit when the overall time period expires.

6. The duty cycle-based bit interface system of claim 5, wherein the bit selector unit comprises:
a first stage digital-to-analog converter in signal communication with the digital signal source and configured to generate an analog signal based on a duty cycle; and
a duty cycle threshold generator circuit in signal communication with a power supply of the first stage digital-to-analog converter and is configured to divide a reference voltage signal into the plurality of threshold duty cycle ranges.

7. The duty cycle-based bit interface system of claim 6, wherein the first stage voltage converter unit includes a digital-to-analog converter configured to convert the digital voltage signal into the analog voltage signal.

8. The duty cycle-based bit interface system of claim 7, wherein the first voltage signal is a digital signal having a fixed frequency and a varying duty cycle, and the second voltage signal is an analog signal.

9. The duty cycle-based bit interface system of claim 7, wherein the digital signal source includes a pulse width modulation (PWM) circuit that generates an input to the first stage voltage signal.

10. The duty cycle-based bit interface system of claim 9, further comprising a second stage signal converter in signal communication with the first stage converter and configured to convert a digital signal having variable frequency and fixed duty cycle into a scaled version of the same that initiates a frequency over/under diagnostic test.

11. A method of controlling a duty cycle-based bit interface system, the method comprising:
converting a first stage voltage signal into a second stage voltage signal;
sampling a duty cycle-based analog output from a portion of a digital-to analog converted (DAC) signal from the first stage voltage signal during a sampling time period; and
outputting a bit enable signal that initiates a specific diagnostic test among a plurality of diagnostic tests based on the duty cycle of the sampled portion.

12. The method of claim 11, further comprising diagnosing operation of a mechanical component included in a vehicle according to the specific diagnostic test in response to outputting the bit enable signal.

13. The method of claim 11, further comprising outputting the bit enable signal in response to a comparison between a duty cycle-based analog voltage signal of the sampled portion and a plurality of threshold duty cycle ranges.

14. The method of claim 13, further comprising assigning each threshold duty cycle range to a specific diagnostic test among a plurality of different diagnostic tests.

15. The method of claim 14, wherein sampling the duty cycle-based analog voltage signal further comprises:
initiating a first timer configured to provide a first time period that encompasses the duty cycle-based analog voltage signal charge period;
in response to expiration of the first time period, triggering a second timer that utilizes the sampled portion of the duty cycle-based analog voltage signal to select a logically determined test during the sampling time period;
disabling retriggering of the first timer circuit while utilizing the sampled portion; and
outputting the trigger control signal to the first timer circuit when the time period expires so as to ready the duty cycle-based bit interface system so as to receive a next commanded test.

16. The method of claim 15, wherein outputting a bit enable signal further comprises:
generating an analog signal based on a duty cycle; and
dividing a voltage reference into the plurality of threshold duty cycle ranges.

17. The method of 16, wherein converting the first stage voltage signal into the second stage voltage signal includes converting a digital voltage signal into a scaled version of the same.

18. The method of claim 17, wherein the first stage digital voltage signal has a fixed frequency and a varying duty cycle.

19. The method of claim 17, wherein generating the first stage digital voltage signal include generating a pulse-width modulated square wave.

20. The method of claim 19, further comprising:
converting a second stage digital signal having variable frequency and fixed duty cycle into a scaled version of the same; and
initiating a frequency over/under diagnostic test based on the second stage digital voltage signal.

* * * * *